United States Patent [19]
Mori

[11] Patent Number: 5,270,403
[45] Date of Patent: Dec. 14, 1993

[54] EPOXY RESIN HARDENER AND EPOXY RESIN COMPOSITION

[75] Inventor: Kunio Mori, Chiba, Japan

[73] Assignee: Dainippon Ink and Chemicals, Inc., Tokyo, Japan

[21] Appl. No.: 859,031

[22] Filed: Mar. 27, 1992

[30] Foreign Application Priority Data

Mar. 29, 1991 [JP] Japan .................................. 3-66462

[51] Int. Cl.$^5$ ............................................. C08F 283/10
[52] U.S. Cl. .................................. 525/534; 528/205; 528/219; 528/96
[58] Field of Search .............. 528/205, 96, 219; 525/534

[56] References Cited

U.S. PATENT DOCUMENTS

| | | | |
|---|---|---|---|
| 3,546,173 | 12/1970 | Hunt | 260/62 |
| 3,936,510 | 2/1976 | Harris et al. | 260/831 |
| 3,996,160 | 12/1976 | Dale et al. | 528/205 |
| 3,996,198 | 12/1976 | Wang et al. | 260/62 |
| 4,085,085 | 4/1978 | Tsuchiya et al. | |
| 4,210,733 | 7/1980 | Hayashi et al. | |
| 4,639,503 | 1/1987 | Hara et al. | |
| 4,824,929 | 4/1989 | Arimatsu et al. | 528/205 |
| 4,927,905 | 5/1990 | Bogan | 528/205 |

FOREIGN PATENT DOCUMENTS

2816112 10/1978 Fed. Rep. of Germany .
3541210 5/1986 Fed. Rep. of Germany .
2337185 7/1977 France .

*Primary Examiner*—John C. Bleutge
*Assistant Examiner*—Randy Gulakowski
*Attorney, Agent, or Firm*—Armstrong, Westerman, Hattori, McLeland & Naughton

[57] ABSTRACT

An epoxy resin hardener includes a synthetic resin obtained by the addition reaction of (A) an aromatic hydrocarbon containing a phenolic hydroxyl group with (B) a compound having at least two ethylenically unsaturated double bonds, the synthetic resin having a structure in which the ethylenically unsaturated double bonds in compound (B) have been opened, with a hydrogen atom that was directly bonded to one of the carbon atoms constituting the aromatic ring(s) in hydrocarbon (A) being addition-bonded to the $\alpha$-position carbon atom in one of the opened double bonds in compound (B) and the $\beta$-position carbon atom in the opened double bond in compound (B) being addition-bonded to that carbon atom in the aromatic ring(s) in hydrocarbon (A) from which the hydrogen atom addition-bonded to the $\alpha$-position carbon atom in the opened double bond in compound (B) has been eliminated. An epoxy resin composition containing an epoxy resin and the hardener is also disclosed.

2 Claims, No Drawings

EPOXY RESIN HARDENER AND EPOXY RESIN COMPOSITION

FIELD OF THE INVENTION

The present invention relates to a hardener for epoxy resins and to an epoxy resin composition.

BACKGROUND OF THE INVENTION

Phenolic novolak resins have conventionally been used as hardeners for epoxy resins. Besides ordinary phenolic novolak resins, an epoxy resin hardener having a similar structure is disclosed in U.S. Pat. No. 3,936,510. This hardener is a synthetic resin obtained by reacting phenol with 1,4-di(methoxymethyl)benzene and having the following structure in which a phenol nucleus, methylene group, benzene nucleus, and methylene group are bonded in this order to form a repeating unit.

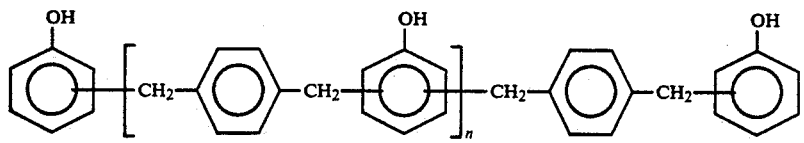

However, the synthetic resin having such a repeating unit has been defective in that use of the synthetic resin as an epoxy resin hardener gives cured epoxy resins having high water absorption and insufficient water resistance.

SUMMARY OF THE INVENTION

The present inventors have conducted intensive studies under these circumstances. As a result, it has been found that cured epoxy resins having significantly improved water resistance are obtained with the use of a synthetic resin, as a hardener for epoxy resins, which has been obtained by the addition reaction of an aromatic hydrocarbon containing a phenolic hydroxyl group with a compound having at least two ethylenically unsaturated double bonds and which has a structure in which the ethylenically unsaturated double bonds in the compound have been opened, with a hydrogen atom that was directly bonded to one of the carbon atoms constituting the aromatic ring(s) in the aromatic hydrocarbon being addition-bonded to the $\beta$-position carbon atom in one of the opened double bonds in the compound and the $\beta$-position carbon atom in the opened double bond in the compound being addition-bonded to that carbon atom in the aromatic ring(s) in the aromatic hydrocarbon from which the hydrogen atom addition-bonded to the $\alpha$-position carbon atom in the opened double bond in the compound has been eliminated. The present invention has been accomplished based on this finding.

Accordingly, the present invention provides an epoxy resin hardener comprising a synthetic resin obtained by the addition reaction of (A) an aromatic hydrocarbon containing a phenolic hydroxyl group with (B) a compound having at least two ethylenically unsaturated double bonds, the synthetic resin having a structure in which the ethylenically unsaturated double bonds in compound (B) have been opened, with a hydrogen atom that was directly bonded to one of the carbon atoms constituting the aromatic ring(s) in hydrocarbon (A) being addition-bonded to the $\alpha$-position carbon atom in one of the opened double bonds in compound (B) and the $\beta$-position carbon atom in the opened double bond in compound (B) being addition-bonded to that carbon atom in the aromatic ring(s) in hydrocarbon (A) from which the hydrogen atom addition-bonded to the $\alpha$-position carbon atom in the opened double bond in compound (B) has been eliminated.

The present invention further provides an epoxy resin composition comprising an epoxy resin and a hardener therefor, the hardener comprising a synthetic resin obtained by the addition reaction of (A) an aromatic hydrocarbon containing a phenolic hydroxyl group with (B) a compound having at least two ethylenically unsaturated double bonds, the synthetic resin having a structure in which the ethylenically unsaturated double bonds in compound (B) have been opened, with a hydrogen atom that was directly bonded to one of the carbon atoms constituting the aromatic ring(s) in hydrocarbon (A) being addition-bonded to the $\alpha$-position carbon atom in one of the opened double bonds in compound (B) and the $\beta$-position carbon atom in the opened double bond in compound (B) being addition-bonded to that carbon atom in the aromatic ring(s) in hydrocarbon (A) from which the hydrogen atom addition-bonded to the $\alpha$-position carbon atom in the opened double bond in compound (B) has been eliminated.

DETAILED DESCRIPTION OF THE INVENTION

The synthetic resin [hereinafter referred to as synthetic resin (I)] which the epoxy resin hardener of the present invention comprises can be easily produced by reacting (A) an aromatic hydrocarbon containing a phenolic hydroxyl group with (B) a compound having at least two ethylenically unsaturated double bonds by means of addition reaction.

This addition reaction includes two steps, that is, step (i) in which a hydrogen atom directly bonded to one of the carbon atoms constituting the aromatic ring(s) in aromatic hydrocarbon (A) containing a phenolic hydroxyl group is added to the $\alpha$-position carbon atom in one of the ethylenically unsaturated double bonds in compound (B) having at least two ethylenically unsaturated double bonds, thereby to form a methyl group; and step (ii) in which the $\beta$-position carbon atom in the opened ethylenically unsaturated double bond in compound (B) is added to that carbon atom in the aromatic ring(s) in hydrocarbon (A) from which the hydrogen atom added to the $\alpha$-position carbon atom in the double bond in compound (B) has been eliminated. Although both steps should take place in order to complete the addition reaction, which one of steps (i) and (ii) takes place first is not particularly important.

As phenolic hydroxyl group-containing aromatic hydrocarbon (A) to be used for producing synthetic resin (I), any of ordinarily used known aromatic hydrocarbons containing a phenolic hydroxyl group may be employed. Examples thereof include phenol, bisphenols such as bisphenol F, bisphenol A, and bisphenol AF, alkyl-substituted phenols such as cresol, xylenol, and p-t-butylphenol, halogenophenols such as bromophenol, aromatic hydrocarbons having two or more phenolic hydroxyl groups such as resorcinol, naphthols and derivatives thereof such as 1-naphthol, 2-naphthol, 1,6-dihydroxynaphthalene, and 2,7-dihydroxynaphthalene, and the like. These aromatic hydrocarbons may be used alone or as a mixture of two or more thereof.

Compound (B) having at least two ethylenically unsaturated double bonds which is to be used for producing synthetic resin (I) may be any of ordinarily used known compounds having two or more ethylenically unsaturated double bonds. Examples thereof include aromatic divinyl compounds such as divinylbenzene, divinylbiphenyl, divinylnaphthalene, and diallyl phthalate, halogenated aromatic divinyl compounds, aliphatic divinyl compounds such as glycerol diallyl ether and trimethylolpropane triacrylate, and the like. Of these, aromatic divinyl compounds are preferably used as compound (B) because of their excellent reactivity and handling properties, with divinylbenzene being especially preferred. Those compounds may be used, as compound (B), alone or as a mixture of two or more thereof.

If required and necessary, compound (B) may be used in combination with a reactive third ingredient. Examples of the third ingredient include aromatic monovinyl compounds such as styrene, methylstyrene, ethylstyrene, monobromostyrene, and the like and aliphatic monovinyl compounds such as methyl (meth)acrylate, stearyl (meth)acrylate, (meth)acrylic acid, N-methylol(meth)acrylamide, γ-mercaptopropyltrimethoxysilane, and the like. These third-ingredient compounds may be used alone or as a mixture of two or more thereof.

In producing synthetic resin (I) which the hardener of the present invention comprises, the amount of compound (B) to be used is not particularly limited and an optimum amount thereof should be suitably selected according to aromatic hydrocarbon (A) to be used. Normally, however, compound (B) is used in an amount of generally from 0.3 to 0.9 mol, preferably from 0.5 to 0.8 mol, per mol of aromatic hydrocarbon (A).

The temperature for the reaction between aromatic hydrocarbon (A) and compound (B) is not particularly limited. It is, however, preferable to use a reaction temperature of 110° C. or higher from the standpoint of rationally carrying out the reaction within a short time period.

A catalyst may be used, if required, in the reaction for producing synthetic resin (I). Exemplary catalysts that can be used include metal chlorides such as aluminum chloride and stannous chloride, inorganic acids such as sulfuric acid, hydrochloric acid, and phosphoric acid, organic sulfonic acids such as benzenesulfonic acid and p-toluenesulfonic acid, organic carboxylic acids such as acetic acid, oxalic acid, and maleic acid, boron fluoride, amine complexes of boron fluoride, phenol complexes of boron fluoride, and the like. These catalysts may be used either alone or as a mixture of two or more thereof.

Preferably used of these catalysts are metal chlorides which are Friedel-Crafts catalysts, inorganic strong acids, and organic sulfonic acids, because they are able to complete the reaction within a short time period and enable the resulting synthetic resin (I) to have a narrow molecular weight distribution.

The amount of a catalyst to be used varies depending on the kind of the catalyst and is not particularly limited. However, the preferred range of catalyst amount is from 0.1 to 5.0 parts by weight per 100 parts by weight of aromatic hydrocarbon (A), since such catalyst amounts enable the reaction to be completed within a short time period and to be easily controlled because the reaction proceeds gently.

The reaction between aromatic hydrocarbon (A) and compound (B) may be conducted either without a solvent or in the presence of an organic solvent. Any of ordinarily used known organic solvents may be used in the reaction. Examples thereof include toluene, xylene, methyl isobutyl ketone, dimethylformamide, dimethyl sulfoxide, Solvesso, and the like. Preferred organic solvents are ones which are capable of dissolving all of aromatic hydrocarbon (A), compound (B), and the product of the reaction thereof, i.e., synthetic resin (I).

In the reaction for producing synthetic resin (I), the ethylenically unsaturated double bonds in compound (B) are opened and the γ-position carbon atoms in the opened double bonds are bonded to carbon atoms which are among the carbon atoms constituting the aromatic ring(s) in aromatic hydrocarbon (A) and from which a hydrogen atom has been eliminated. As a result, a synthetic resin having methyl groups as pendant groups is obtained.

In the case where an aromatic hydrocarbon having only one aromatic ring is used as component (A) to produce synthetic resin (I), this reaction product usually has the following structure:

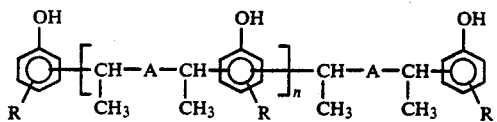

wherein A's each represents a divalent group, R's are identical or different and each represents a hydrogen atom, an alkyl group, a hydroxyl group, or a halogen atom, and n is an integer of from 1 to 6.

The divalent groups represented by A in the above formula preferably are a divalent aromatic group which may have a substituent. Examples of such an aromatic group include 1,4-phenylene, 1,3-phenylene, 2-methyl-1,4-phenylene, 2-bromo-1,4-phenylene, 4,4-biphenylene, 1,6-naphthylene, 2,7-naphthylene, and the like. Compared to monocyclic aromatic groups, condensed polycyclic aromatic groups tend to impart better heat and water resistance to the final cured epoxy resin. A representative aromatic group which may have a substituent is a phenylene group which may have a substituent. In this case, synthetic resin (I) has the following structure:

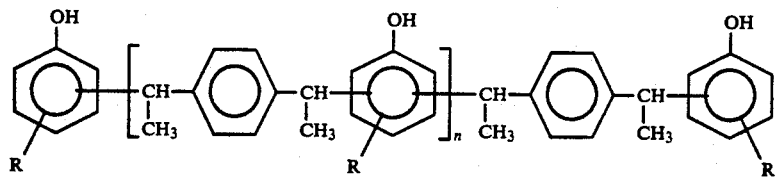

wherein R's are identical or different and each represents a hydrogen atom, an alkyl group, a hydroxyl group, or a halogen atom, and n is an integer of from 1 to 6.

For example, synthetic resin (I) produced using phenol as aromatic hydrocarbon (A) and divinylbenzene as compound (B) has the following structure:

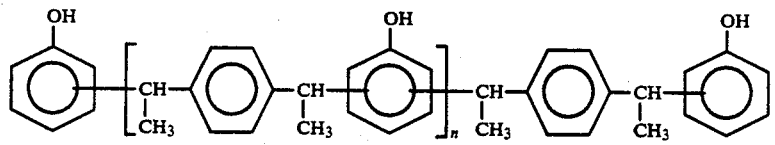

wherein n is an integer of from 1 to 6.

Other specific examples of synthetic resin (I) include the following, in which n is an integer of from 1 to 6.

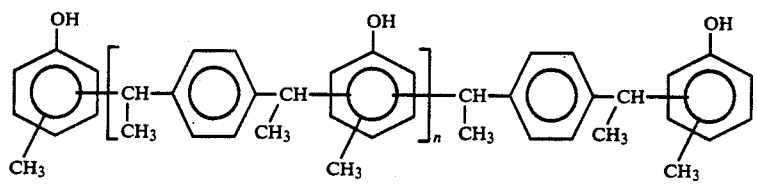

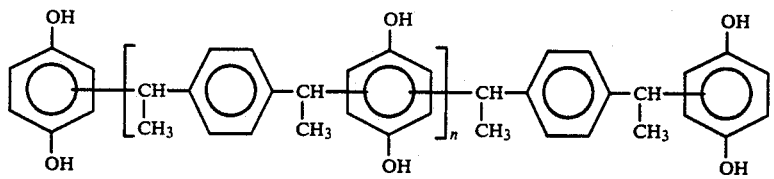

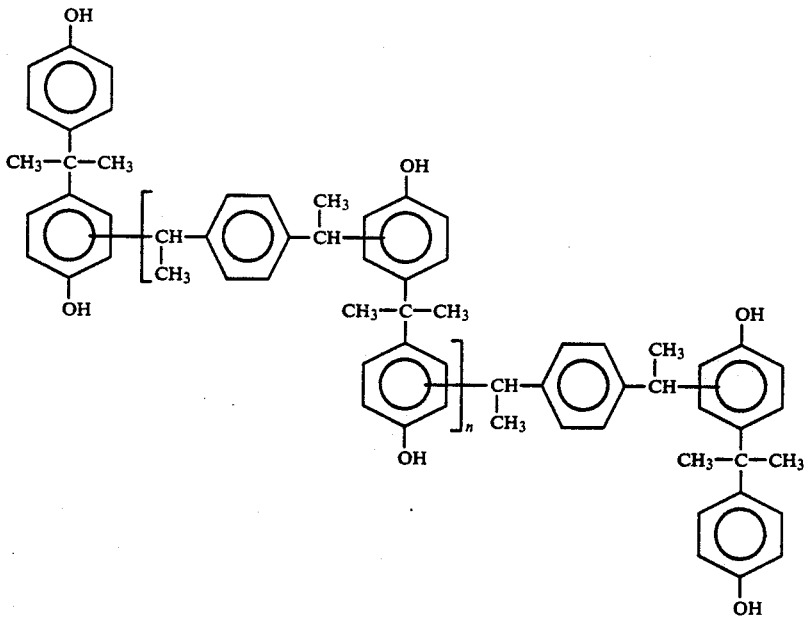

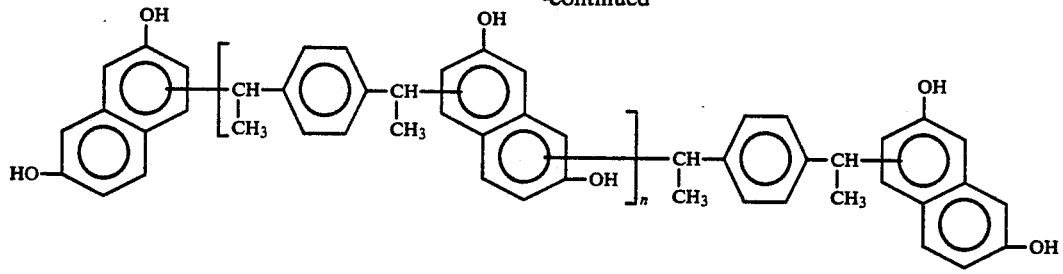

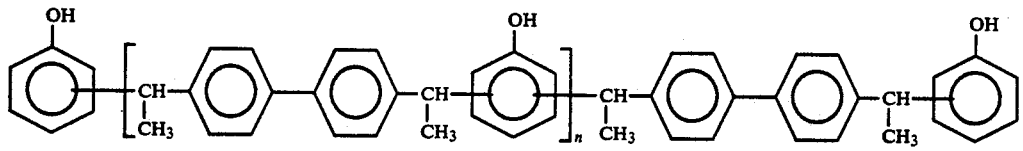

Synthetic resin (I) described above may be used alone as the epoxy resin hardener of the present invention. If required and necessary, however, synthetic resin (I) may be used in combination with an ordinarily employed known epoxy resin hardener. Exemplary known hardeners for epoxy resins include dicyandiamide, polyalkylene polyamines, polyamide polyamines, Mannich reaction products, phenolic novolak resins, o-cresol novolak resins, naphthol novolak resins, brominated phenolic novolak resins, and resins represented by the formula

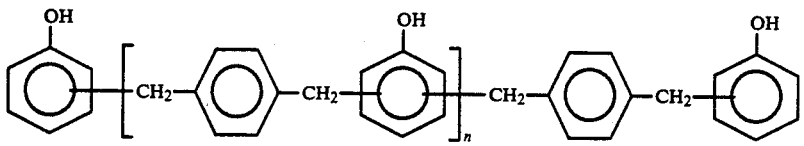

wherein n is an integer of from 1 to 6.

By blending an epoxy resin with the hardener of the present invention which comprises synthetic resin (I) or a combination thereof with one or more known epoxy resin hardeners such as those enumerated above, a curable epoxy resin composition can be prepared.

The epoxy resin used for preparing the epoxy resin composition according to the present invention is not particularly limited. Examples of the epoxy resin include bisphenol diglycidyl ether type epoxy resins obtained using bisphenols, such as bisphenol F and bisphenol A, as starting materials; novolak type polyfunctional epoxy resins obtained using ordinary phenolic novolak resins, o-cresol novolak resins, brominated phenolic novolak resins, or resins of the formulae

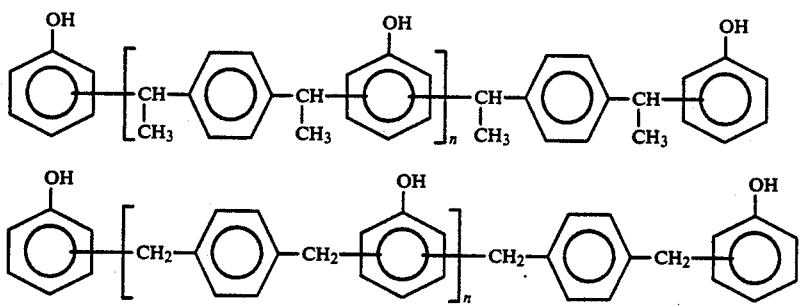

wherein n is an integer of from 1 to 6; glycidylamine type polyfunctional epoxy resins such as diphenylmethanediamine tetraglycidyl ether and cyclohexanediamine tetraglycidyl ether; aliphatic epoxy resins such as poly(ethylene glycol) diglycidyl ether, epoxidized SBR, and epoxidized soybean oil; and the like.

The blend ratio of an epoxy resin to synthetic resin (I) varies depending on the kinds of the ingredients. In general, however, an epoxy resin and synthetic resin (I) are blended in such a proportion that the amount of phenolic hydroxyl groups contained in synthetic resin (I) is equivalent to that of epoxy groups contained in the epoxy resin.

A curing accelerator selected from generally employed ones may be incorporated into the epoxy resin composition in order to accelerate the curing and crosslinking of the composition. Examples of the curing accelerator include imidazole derivatives such as N-methylimidazole, tertiary amines such as triethylamine, phosphorus compounds such as triphenylphosphine, and the like.

In the case where the epoxy resin composition of the present invention is required to give a cured product having exceedingly high properties, it is preferable to prepare the composition by combining the above-described synthetic resin (I) with an epoxy resin obtained by reacting synthetic resin (I) with an epihalohydrin. Compositions based on this combination are especially suited for use in the production of electrically insulating laminates.

The epoxy resin composition of the present invention may be formulated so as to be cured by the combined use of actinic rays and heat. This can be attained by incorporating, into the composition, a so-called epoxy acrylate obtained by the addition of (meth)acrylic acid to an epoxy resin, an aromatic divinyl compound such as divinylbenzene, an alkyldivinylbenzene, or diallyl phthalate, an aliphatic divinyl compound such as glycerol diallyl ether or trimethylolpropane triacrylate, an aromatic monovinyl compound such as styrene, methylstyrene, ethylstyrene, or monobromostyrene, an aliphatic monovinyl compound such as methyl (meth)acrylate, stearyl (meth)acrylate,(meth)acrylicacid, N-methylol(meth)acrylamide, or γ-mercaptopropyltrimethoxysilane, or the like along with, if needed, a heat polymerization initiator or photopolymerization initiator which can induce polymerization of such an additional ingredient.

By use of the above-described synthetic resin (I) as a hardener for epoxy resins, cured resins can be obtained which not only have lower water absorption and better water resistance than conventional cured epoxy resins, but also have little strain and are less apt to suffer heat shrinkage.

In the epoxy resin composition of the present invention, various fillers and additives may be incorporated before use according to need. Examples of additives include a coupling agent, flame retardant, lubricant, releasing agent, plasticizer, colorant, thickener, and the like.

The epoxy resin composition of the present invention is expected to bring about performance improvements in various applications where ordinary novolak resins have conventionally been used as hardeners for epoxy resins; such applications include, for example, copper clad electrical insulating laminates, prepregs as a precursor therefor, covering materials, coating materials, molding materials, and the like.

On the other hand, synthetic resin (I) which the epoxy resin hardener of the present invention comprises may be combined with such a hardener as, for example, hexamethylenetetramine. This combination can be advantageously used as a foundry binder, grinding wheel binder, binder for glass fibers or carbon fibers, refractory binder, brake lining binder, clutch facing binder, IC potting material, wall covering material for houses or aircraft, heat insulation material, raw material for phenolic foams, and a material for various products including bathtubs, waterproof pans, sink cabinets, corrugated sheets, water storage tanks, and pleasure boats.

As described above, since synthetic resin (I) which the epoxy resin hardener of the present invention comprises has a methylmethylene group, it has the significant effect of providing cured epoxy resin compositions having extremely low water absorption, compared to the conventional synthetic resins having a mere methylene group. Therefore, by use of this specific synthetic resin according to the present invention as a hardener for an epoxy resin, an epoxy resin composition can be obtained which gives a cured epoxy resin having excellent water resistance.

The present invention will be explained below in more detail with reference to the following Synthesis Examples and Examples, but the invention is not construed as being limited thereto. In these examples, all parts and percents are by weight.

SYNTHESIS EXAMPLE 1

Into a four-necked 3-liter flask equipped with a stirrer, condenser, thermometer, and dropping funnel were introduced 940 g (10 mol) of phenol and 4.7 g of aluminum chloride as a catalyst. The contents in the flask were heated to 90° C. Dropwise addition of divinylbenzene from the dropping funnel was then initiated, with the temperature of the mixture in the flask being allowed to rise to 140° C. by utilizing heat generation. Thus, over a period of about 2 hours, 885 g (6.8 mol) of divinylbenzene was dropwise added in total, while the temperature was kept at 135°–145° C. The resulting reaction mixture was allowed to react for another 3 hours and then taken out of the reactor, thereby obtaining a novolak type synthetic resin as a yellow mass. This resin had a melting point of 63° C. (capillary method) and a number-average molecular weight of 990.

The structure of the thus-obtained resin was determined by $^{13}C$ nuclear magnetic resonance spectroscopy (hereinafter referred to as $^{13}C$-NMR), mass spectrometry (hereinafter referred to as MS), infrared absorption spectroscopy (hereinafter referred to as IR), high-speed liquid chromatography (hereinafter referred to as HPLC), etc.

As a result, the $^{13}C$-NMR spectrum had a peak indicating that the α-position carbon in a vinyl group of the divinylbenzene was bonded to a phenol nucleus, but no peak was observed which indicated bonding of the β-position carbon to a phenol nucleus.

MS gave a spectrum having signals at the positions of 318, 542, 766, 990, and 1241. These signals are thought to correspond to molecules containing 2, 3, 4, 5, and 6 phenol nuclei, respectively.

Similar results were obtained by HPLC. That is, the chromatogram of the synthetic resin had peaks which are thought to correspond to the numbers (n), 1, 2, and 3, respectively, of a repeating unit made up of a phenol nucleus, methylmethylene group, phenylene group, and methylmethylene group bonded in this order, with a phenol nucleus being bonded to the methylmethylene-side end of the chain consisting of one or more such repeating units and a methylmethylene group, phenylene group, methylmethylene group, and phenol nucleus being bonded in this order to the phenol nucleus-side end. Although peaks presumed to be attributable to molecules having repeating unit numbers, n, of 4 and larger overlapped, the presence of each of such molecules was ascertained by separation and analysis with a gas chromatography-mass spectrometer. The average of the repeating unit numbers, n, was 3.

From these results, the synthetic resin obtained above was thought to have the following structure.

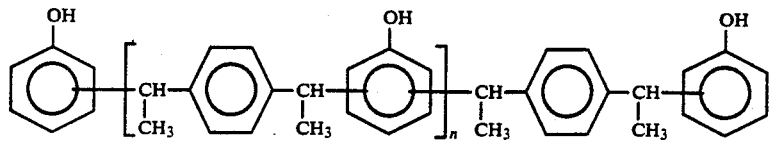

SYNTHESIS EXAMPLE 2

Into a four-necked 3-liter flask equipped with a stirrer, condenser, thermometer, and dropping funnel were introduced 1,080 g (10 mol) of m-cresol and 2.2 g of p-toluenesulfonic acid as a catalyst. The contents in the flask were heated to 100° C. Dropwise addition of pure divinylbenzene from the dropping funnel was then initiated, with the temperature of the mixture in the flask being allowed to rise to 150° C. by utilizing heat generation. Thus, over a period of about 2 hours, 846 g (6.5 mol) of divinylbenzene was dropwise added in total, while the temperature was kept at 145°–155° C. The resulting reaction mixture was allowed to react for another 2 hours and then taken out of the reactor, thereby obtaining a novolak type synthetic resin as a yellow mass. This resin had a melting point of 60° C. (capillary method) and a number-average molecular weight of 915.

The structure of the thus-obtained resin was determined by $^{13}$C-NMR, MS, IR, HPLC, etc.

As a result, the $^{13}$C-NMR spectrum had a peak indicating that the α-position carbon in a vinyl group of the divinylbenzene was bonded to a phenol nucleus, but no peak was observed which indicated bonding of the β-position carbon to a phenol nucleus.

MS gave a spectrum having signals at the positions of 346, 584, 822, 1060, and 1298. These signals are thought to correspond to molecules containing 2, 3, 4, 5, and 6 phenol nuclei, respectively.

Similar results were obtained by HPLC. That is, the chromatogram of the synthetic resin had peaks which are thought to correspond to the numbers (n), 1, 2, and 3, respectively, of a repeating unit made up of a methyl group-containing phenol nucleus, methylmethylene group, phenylene group, and methylmethylene group bonded in this order, with a methyl group-containing phenol nucleus being bonded to the methylmethylene-side end of the chain consisting of one or more such repeating units and a methylmethylene group, phenylene group, methylmethylene group, and methyl group-containing phenol nucleus being bonded in this order to the methyl group-containing phenol nucleus-side end. Although peaks presumed to be attributable to molecules having repeating unit numbers, n, of 4 and larger overlapped, the presence of each of such molecules was ascertained by separation and analysis with a gas chromatography-mass spectrometer. The average of the repeating unit numbers, n, was 2.4.

From these results, the synthetic resin obtained above was thought to have the following structure.

SYNTHESIS EXAMPLE 3

Into a four-necked 3-liter flask equipped with a stirrer, condenser, thermometer, and dropping funnel were introduced 1,100 g (10 mol) of resorcinol, 5.5 g of oxalic acid dihydrate as a catalyst, and 1,139 g of 80% divinylbenzene. Stirring was then initiated and the temperature of the mixture in the flask was allowed to rise to 150° C. by utilizing heat generation. The reaction mixture was allowed to react for about 4 hours while the temperature was kept at 145°–155° C. The contents were then taken out of the reactor, thereby obtaining a novolak type synthetic resin as a yellow mass. This resin had a melting point of 62° C. (capillary method) and a number-average molecular weight of 1,080.

The molecules of this synthetic resin were presumed to have a repeating unit made up of a phenol nucleus having two hydroxyl groups, a methylmethylene group, a phenylene group, and a methylmethylene group bonded in this order, with a phenol nucleus having two hydroxyl groups being bonded to the methylmethylene-side end of the chain consisting of one or more such repeating units and a methylmethylene group, phenylene group, methylmethylene group, and phenol nucleus having two hydroxyl groups being bonded in this order to the phenol nucleus-side end. The average of the repeating unit numbers, n, was 3.

From these results, the synthetic resin obtained above was thought to have the following structure.

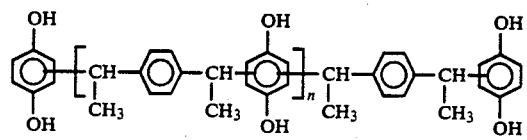

SYNTHESIS EXAMPLE 4

Into a four-necked 3-liter flask equipped with a stirrer, condenser, thermometer, and dropping funnel were introduced 940 g (10 mol) of phenol and 1.9 g of diethyl sulfate. Thereafter, p-xylylene glycol dimethyl ether was added little by little from the dropping funnel in a total amount of 1,079 g (6.5 mol). The reaction mixture was allowed to react for about 3 hours while the temperature was kept at 150°–160° C., during which period a theoretical amount of methanol was liberated from the reaction mixture. The contents were then taken out of the reactor, thereby obtaining a novolak type phenol-aralkyl resin having a melting point of 65° C. (capillary method).

This synthetic resin had the following structure, with the average of the repeating unit numbers, n, being 3.

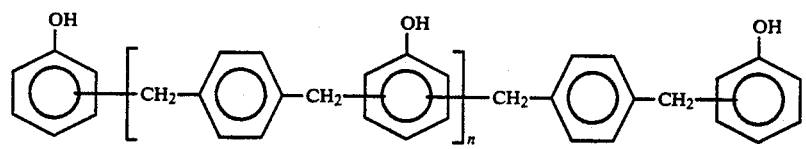

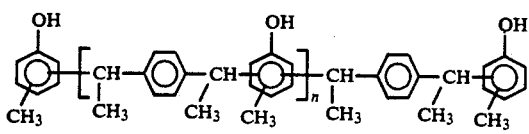

EXAMPLE 1

100 Parts of the synthetic resin obtained in Synthesis Example 1 was melted by heating it to 100° C. Subsequently, 0.1 part of N-methylimidazole as a curing accelerator for epoxy resin was added to the melt to prepare a uniform solution at a high temperature. With this solution was mixed 104 parts of epoxy resin Epiclon 850 (bisphenol A diglycidyl ether type epoxy resin manufactured by Dainippon Ink & Chemicals, Inc.) heated beforehand to 100° C. The resulting mixture was degassed under a reduced pressure and then heat-treated at 150° C. for 1 hour and subsequently at 180° C. for 2 hours, thereby obtaining a cured epoxy resin.

EXAMPLE 2

The same procedures as in Example 1 were conducted except that 100 parts of the synthetic resin obtained in Synthesis Example 2 and 98 parts of Epiclon 850 were used. Thus, a cured epoxy resin was obtained.

EXAMPLE 3

The same procedures as in Example 1 were conducted except that 100 parts of the synthetic resin obtained in Synthesis Example 3 and 169 parts of Epiclon 850 were used. Thus, a cured epoxy resin was obtained.

COMPARATIVE EXAMPLE 1

100 Parts of phenolic novolak resin Varcum TD-2131 (manufactured by Dainippon Ink & Chemicals, Inc.) was melted by heating it to 120° C. Subsequently, 0.1 part of N-methylimidazole was added to the melt to prepare a uniform solution at a high temperature. With this solution was mixed 182 parts of Epiclon 850 heated beforehand to 100° C. The resulting mixture was degassed under a reduced pressure and then heat-treated at 150° C. for 1 hour and subsequently at 180° C. for 2 hours, thereby obtaining a cured epoxy resin.

COMPARATIVE EXAMPLE 2

100 Parts of the phenol-aralkyl resin obtained in Synthesis Example 4 was melted by heating it to 100° C. Subsequently, 0.1 part of N-methylimidazole was added to the melt to prepare a uniform solution at a high temperature. With this solution was mixed 118 parts of Epiclon 850 heated beforehand. The resulting mixture was treated in the same manner as in Comparative Example 1, thereby obtaining a cured epoxy resin.

The cured epoxy resins as obtained in Examples 1 to 3 and Comparative Examples and 2 were evaluated for water absorption and other performances. The results obtained are summarized in Table 1.

In the measurement, flexural strength, flexural modulus, water absorption, and specific gravity were measured according to JIS K-6911, heat distortion temperature was measured according to JIS K-7207, and Rockwell hardness was measured according to JIS K-7209 (scale M).

In Table 1, *1) and *2) for water absorption indicate weight increases (percent) of cured resin as measured after 2-hour immersion and 4-hour immersion in boiling water, respectively.

TABLE 1

| | Example 1 | Comparative Example 1 | Comparative Example 2 | Example 2 | Example 3 |
|---|---|---|---|---|---|
| Flexural strength (kg/mm$^2$) | 12.7 | 12.3 | 11.7 | 11.9 | 12.4 |
| Flexural modulus (kg/mm$^2$) | 335 | 283 | 321 | 327 | 313 |
| Rockwell Hardness | 105 | 107 | 105 | 104 | 105 |
| Specific gravity (g/cm$^3$) | 1.18 | 1.19 | 1.18 | 1.17 | 1.19 |
| Heat distortion temperature (°C.) | 113 | 119 | 121 | 122 | 116 |
| Water absorption (%) | | | | | |
| *1) | 0.18 | 0.37 | 0.28 | 0.14 | 0.20 |
| *2) | 0.21 | 0.48 | 0.39 | 0.18 | 0.25 |

As apparent from Table 1, the cured epoxy resins cured with the synthetic resins according to the present invention showed extremely good water resistance as compared with the cured resins cured with conventional hardeners.

While the invention has been described in detail and with reference to specific embodiments thereof, it will be apparent to one skilled in the art that various changes and modifications can be made therein without departing from the spirit and scope thereof.

What is claimed is:

1. An epoxy resin composition comprising an epoxy resin and a hardener therefor, said hardener comprising a synthetic resin obtained by the addition reaction of (A) an aromatic hydrocarbon containing a phenolic hydroxyl group with (B) a compound having at least two ethylenically unsaturated double bonds, said synthetic resin having a structure in which the ethylenically unsaturated double bonds in compound (B) have been opened, with a hydrogen atom that was directly bonded to one of the carbon atoms constituting the aromatic ring(s) in hydrocarbon (A) being addition-bonded to the α-position carbon atom in one of the opened double bonds in compound (B) and the β-position carbon atom in said opened double bond in compound (B) being addition-bonded to that carbon atom in the aromatic ring(s) in hydrocarbon (A) from which the hydrogen atom addition-bonded to the α-position carbon atom in said opened double bond in compound (B) has been eliminated.

2. An epoxy resin composition as in claim 1, wherein said hardener comprises a synthetic resin represented by the following formula:

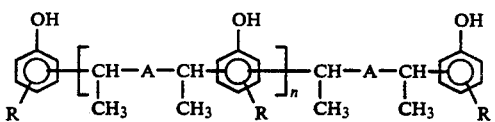

wherein A's each represents a divalent group, R's are identical or different and each represents a hydrogen atom, an alkyl group, a hydroxyl group, or a halogen atom, and n is an integer of from 1 to 6.

* * * * *